United States Patent
Baum et al.

(10) Patent No.: US 6,849,200 B2
(45) Date of Patent: Feb. 1, 2005

(54) COMPOSITION AND PROCESS FOR WET STRIPPING REMOVAL OF SACRIFICIAL ANTI-REFLECTIVE MATERIAL

(75) Inventors: Thomas H. Baum, New Fairfield, CT (US); David Bernhard, Newtown, CT (US); David Minsek, Pleasantville, NY (US); Melissa Murphy, Danbury, CT (US)

(73) Assignee: Advanced Technology Materials, Inc., Danbury, CT (US)

( * ) Notice: Subject to any disclaimer, the term of this patent is extended or adjusted under 35 U.S.C. 154(b) by 14 days.

(21) Appl. No.: 10/201,340

(22) Filed: Jul. 23, 2002

(65) Prior Publication Data

US 2004/0016904 A1 Jan. 29, 2004

(51) Int. Cl.$^7$ ................................. C09K 13/00
(52) U.S. Cl. ....................... 252/79.1; 438/745
(58) Field of Search ................. 438/745; 252/79.1; 134/1.1, 1.2, 1.3; 216/106, 108

(56) References Cited

U.S. PATENT DOCUMENTS

| | | | |
|---|---|---|---|
| 4,343,677 A | 8/1982 | Kinsbron et al. | |
| 4,582,624 A | * 4/1986 | Enjo et al. | ................. 252/79.4 |
| 4,795,582 A | 1/1989 | Ohmi et al. | |
| 5,571,447 A | 11/1996 | Ward et al. | |
| 5,630,904 A | 5/1997 | Aoyama et al. | |
| 5,698,503 A | 12/1997 | Ward et al. | |
| 5,792,274 A | 8/1998 | Tanabe et al. | |
| 5,905,063 A | 5/1999 | Tanabe et al. | |
| 5,962,385 A | 10/1999 | Maruyama et al. | |
| 5,972,123 A | * 10/1999 | Verhaverbeke | ................. 134/3 |
| 6,224,785 B1 | 5/2001 | Wojtczak et al. | |
| 6,235,693 B1 | 5/2001 | Cheng et al. | |
| 6,248,704 B1 | 6/2001 | Small et al. | |
| 6,265,309 B1 | 7/2001 | Gotoh et al. | |
| 6,268,457 B1 | 7/2001 | Kennedy et al. | |
| 6,306,807 B1 | 10/2001 | Wojtczak et al. | |
| 6,363,765 B1 | 4/2002 | Seok et al. | |
| 6,365,529 B1 | 4/2002 | Hussein et al. | |
| 6,383,410 B1 | 5/2002 | Wojtczak et al. | |
| 6,453,914 B2 | 9/2002 | Torek et al. | |
| 6,562,726 B1 | * 5/2003 | Torek et al. | ................. 438/745 |
| 6,585,910 B1 | 7/2003 | Kikuyama et al. | |

* cited by examiner

*Primary Examiner*—Kin-Chan Chen
(74) *Attorney, Agent, or Firm*—Margaret Chappuis; Steven Hultquist, Esq.

(57) ABSTRACT

A composition and process for wet stripping removal of sacrificial anti-reflective silicate material, e.g., from a substrate or article having such material deposited thereon, particularly where the sacrificial anti-reflective material is present with permanent silicate materials desired to be unaffected by the wet stripping composition.

23 Claims, No Drawings

COMPOSITION AND PROCESS FOR WET STRIPPING REMOVAL OF SACRIFICIAL ANTI-REFLECTIVE MATERIAL

BACKGROUND OF THE INVENTION

1. Field of the Invention

The present invention relates to a wet stripping composition and process useful for silicate stripping, e.g., wet stripping removal of sacrificial anti-reflective silicate material from a substrate or article having such material deposited thereon, particularly where the sacrificial anti-reflective silicate material is present with permanent silicate materials desired to be unaffected by the wet stripping composition.

2. Description of the Related Art

During the fabrication of integrated circuits, silicate materials may be used as sacrificial layers, with the sacrificial layer being removed before completion of the device. U.S. Pat. No. 6,365,529 (assigned to Intel), "Method for Patterning Dual Damascene Interconnects Using a Light Absorbing Material," describes a method for making dual-damascene structures using a dyed spin-on glass (SOG) material as a sacrificial anti-reflective coating that minimizes reflectivity variations during photolithographic patterning. Ultimately selective removal of the sacrificial material is necessary, which typically is effected by wet etching, using a wet etchant that demonstrates higher selectivity towards the sacrificial layer in relation to other materials that may be present in the structure, including inter-level dielectrics (ILD), metals, and barrier layers.

It is well-established that hydrogen fluoride (HF) solutions may be used to etch silicon oxide materials. However, HF solutions etch silicon oxides rapidly and non-selectively, and thereby may cause damage or loss of other silicate-containing materials in the device, especially silicate materials that are commonly used as ILDs. Such ILD materials include, by way of example, silicon dioxide, fluorinated silicate glass (FSG), and organosilicate glass (OSG), including both porous and non-porous materials.

In order to more carefully control the etch rate and selectivity of a fluoride solution towards silicon oxides, the HF acid solution may be buffered with amines or other bases such as ammonia or alkylamines, since buffering reduces the concentration of the active HF.

Additionally, the etch rate and/or selectivity of the fluoride solutions towards silicate glasses may be controlled by adding specific chelators to the solutions. The chelator interacts with the fluoride silicate reaction, and thus is capable of accelerating or retarding the etch rate. Chelators interact with different substrates by specific interactions that are both chelator-specific and substrate-specific. This specificity allows modification of the etch rate selectivity of a solution towards different substrates.

It would therefore be a substantial advance in the art to provide a wet cleaner that possesses high etch rate selectivity, i.e., high etch rate on a sacrificial silicate material and low etch rate on permanent silicate ILD materials, in applications where sacrificial and permanent silicates are both present in the original material.

Additionally, it would be desirable to provide a wet cleaner of such type that utilizes a safe, non-combustible solvent system, such as a semi-aqueous solvent system characterized by low toxicity and low combustibility.

These and other objects are achieved by the composition and method of the present invention, as hereinafter more fully described.

With reference to the present invention, as hereinafter more fully described, the state of the art forming a background to the present invention includes the following U.S. patents, the disclosures of which hereby are incorporated herein, in their respective entireties.

U.S. Pat. Nos. 5,698,503 and 5,571,447 (Ashland) describe a cleaning composition containing a glycol solvent, ammonium fluoride, dimethylsulfoxide, and water in a buffered acidic system having a pH of 4 to 7.

U.S. Pat. Nos. 5,630,904, 5,962,385 and 6,265,309 (Mitsubishi Gas) describe residue cleaning formulations for semiconductor substrates, in which the cleaning formulations contain fluoride, solvents and a buffer system.

U.S. Pat. Nos. 5,905,063 and 5,792,274 (Tokyo Ohka Kogyo) describe residue cleaning formulations for semiconductor substrates, in which the cleaning formulations contain a hydrofluoric acid salt with a metal-free base, solvents and a buffer system, having a pH of 5 to 8.

U.S. Pat. Nos. 6,235,693 and 6,248,704 (EKC Technology) describe cleaning formulations containing fluoride, water, and solvent(s), for cleaning residue from semiconductor substrates, in which the cleaning formulations have a pH of 6 to 10.

U.S. Pat. Nos. 6,365,765 and 6,268,457 (Honeywell) describe a method of making dyed spin-on glass (SOG) polymers by reacting alkoxysilanes with organic dyes, where the spin-on glass is used as a sacrificial anti-reflective coating (SARC).

U.S. Pat. No. 6,365,529 (Intel) describes a method for making dual damascene structures using a dyed spin-on glass (SOG) material as a SARC material.

U.S. Pat. No. 6,306,807 (ATMI) discloses formulations for cleaning post-plasma etch residues from semiconductor substrates, containing boric acid, amine(s), water, and optionally a glycol solvent or chelator.

U.S. Pat. No. 6,224,785 (ATMI) discloses formulations containing ammonium fluoride, amine(s), water, and a chelating agent, as useful for cleaning post plasma ash residues from semiconductor substrates.

U.S. Pat. No. 6,383,410 (ATMI) discloses formulations for selective etching of silicon oxides utilizing compositions containing fluoride salts, chelating agent, and glycol solvent.

U.S. Pat. No. 4,343,677 (Kinsbron et al.) discloses a formulation for etching silicon dioxide, utilizing ammonium fluoride/hydrofluoric acid in a molar ratio of about 10:1 in water/ethylene glycol.

None of the above patents, however, discloses or suggests a wet cleaner or method of wet stripping for the selective removal of sacrificial anti-reflective coatings (SARC) comprising a dyed silicate glass material. The present invention therefore achieves a substantial advance in the art, as will be more fully appreciated from the ensuing description.

SUMMARY OF THE INVENTION

The present invention relates generally to compositions and processes useful for wet stripping removal of siliceous materials, such as the removal of sacrificial anti-reflective silicate material from a material, substrate, surface or article including such sacrificial anti-reflective silicate material or having such sacrificial anti-reflective silicate material deposited thereon, particularly where the sacrificial anti-reflective material is present with permanent silicate materials desired to be unaffected by the wet stripping operation.

The present invention in one aspect relates to a wet stripping composition, comprising:
a nitrogenous hydrofluoride;
deionized water;
organic solvent;
and optionally:
chelator and/or amine/carboxylic acid buffer.

The nitrogenous hydrofluoride may be of any suitable type, and comprises compounds such as ammonium fluoride and other amine hydrofluoride salts.

Another aspect of the invention relates to a wet stripping composition comprising:
0.1–40.0 weight % ammonium fluoride ($NH_4F$) or other amine hydrofluoride salt
20–75 weight % deionized water (DIW)
25–79 weight % organic solvent
0–10 weight % chelator
0–20 weight % amine/carboxylic acid buffer
wherein weight percentages are based on total weight of the composition, and total weight percentages do not exceed 100 weight %.

In a further aspect, the invention relates to a wet stripping composition selected from the group consisting of Formulations A–K:

Formulation A
0.5% IDA
1.0% $NH_4F$
98.5% mixture 3:1 propyleneglycol:water
Formulation B
1.5% IDA
1.0% $NH_4F$
97.5% mixture 3:1 propyleneglycol:water
Formulation C
0.5% IDA
4.0% $NH_4F$
95.5% mixture 3:1 propyleneglycol:water
Formulation D
1.5% IDA
4.0% $NH_4F$
94.5% mixture 3:1 propyleneglycol:water
Formulation E
0.5% IDA
1.0% $NH_4F$
25% water
73.5% diethylene glycol
Formulation F
0.5% IDA
1.0% NH4F
25% water
73.5% propylene glycol methyl ether
Formulation G
0.5% IDA
1.0% NH4F
25% water
73.5% diethylene glycol methyl ether
Formulation H
0.5% IDA
1.0% NH4F
25% water
73.5% triethylene glycol methyl ether
Formulation I
0.5% ammonium fluoride
2.25% methyldiethanolamine
2.75% malonic acid
25% water
69.5 diethyleneglycol
Formulation J
10% N,N-dimethyldiglycolamine hydrofluoride salt
25% water
65% diethylene glycol
Formulation K
40% N,N-dimethyldiglycolamine hydrofluoride salt
25% water
35% diethyleneglycol
wherein percentages of components in said Formulations are by weight, based on total weight of the Formulation.

Yet another aspect of the invention relates to a wet stripping composition comprising semi-aqueous solvent, ammonium fluoride and an amino acid conferring on the composition etch rate selectivity between SARC and ILD materials.

In another aspect, the invention relates to a method of etchingly removing sacrificial silicate material from a locus comprising same, in which the sacrificial silicate material is exposed to an etchant composition comprising:
a nitrogenous hydrofluoride;
deionized water;
organic solvent;
and optionally:
chelator and/or amine/carboxylic acid buffer,
for sufficient time to at least partially etchingly remove the sacrificial silicate from the locus.

Other aspects, features and advantages of the invention will be more fully apparent from the ensuing disclosure and appended claims.

DETAILED DESCRIPTION OF THE INVENTION, AND PREFERRED EMBODIMENTS THEREOF

The present invention in one illustrative embodiment thereof provides a wet stripping composition including the following components:
0.1–40.0 weight % ammonium fluoride ($NH_4F$) or other amine hydrofluoride salt
20–75 weight % deionized water (DIW)
25–79 weight % organic solvent
0–10 weight % chelator
0–20 weight % amine/carboxylic acid buffer
wherein percentages of the components are percentages by weight, based on total weight of the composition, and wherein the total of the weight percentages of such components of the composition does not exceed 100 weight %.

The stripping composition specified above may optionally include additional components, including active as well as inactive ingredients, e.g., stabilizers, dispersants, antioxidants, fillers, penetration agents, adjuvants, additives, fillers, excipients, etc.

In a preferred aspect, the stripping composition consists essentially of the specified components listed by weight percentages above, wherein the specified components are present in the composition at concentrations within the respective specified weight % ranges.

Most preferably, the stripping composition contains only the specified components listed by weight percentages above, in concentrations within the respective specified weight % ranges, and wherein the weight percentages of all of such specified components that are present in the composition total to 100 weight %.

The organic solvent in stripping compositions of the present invention may include any suitable organic solvent species. In a preferred aspect, the organic solvent in stripping compositions of the invention include one or more of (i) glycols such as ethylene glycol, propylene glycol, neopentyl glycol, etc., (ii) polyglycol(s) such as polyethylene glycol, polypropylene glycol, etc, (iii) glycol ethers, or (iv) polyglycol ethers, or the organic solvent in such stripping compositions of the invention may alternatively include compatible mixtures, blends or solutions of two or more solvent components selected from among such classes (i)–(iv).

The chelator in stripping compositions of the invention may be of any suitable type. In a preferred aspect, the chelator comprises an α-amino acid, such as iminodiacetic acid (IDA), whose formula is shown below.

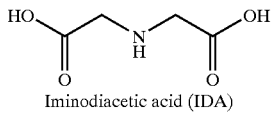

Iminodiacetic acid (IDA)

Other chelatingly effective species may be employed, alternatively or in various combinations, to provide the stripping composition with a chelator that serves the function of controlling the etch rate selectivity between SARC and ILD materials.

The amine/carboxylic acid buffer in stripping compositions of the invention may be of any suitable type, and may for example include alkyl-, dialkyl-, and/or trialkyl-amine(s) with mono-, di-, and/or tri-carboxylic acid(s). The buffer serves the function of appropriately stabilizing the pH of the stripping composition, since silicate etch rates are strongly pH-dependent. The buffer may also serve the function of controlling the etch rate selectivity between the SARC and ILD materials in use of the stripping composition.

The stripping compositions of the invention are easily formulated by simple addition of the respective ingredients and mixing to homogeneous condition.

In stripping application, the stripping composition is applied in any suitable manner to the material to be stripped, e.g., by spraying the stripping composition on the surface of the material to be stripped, by dipping (in a volume of the stripping composition) of the material or article including the material to be stripped, by contacting the material or article to be stripped with another material, e.g., a pad, or fibrous sorbent applicator element, that is saturated with the stripping composition, or by any other suitable means, manner or technique, by which the stripping composition is brought into stripping contact with material to be stripped.

As applied to semiconductor manufacturing operations, the stripping compositions of the present invention are usefully employed to etchingly remove sacrificial silicate materials from substrates and semiconductor device structures on which the sacrificial silicate material has been deposited. For example, the sacrificial silicate may be applied as an anti-reflective coating to minimize reflectivity variations during photolithographic patterning on a semiconductor device structure.

The compositions of the present invention, by virtue of their selectivity for such sacrificial silicates, relative to other materials that may be present on the semiconductor substrate and exposed to the stripping composition, such as ILD structures, metallization, barrier layers, etc., achieve etch removal of the sacrificial silicates in a highly efficient manner.

Following the achievement of the desired stripping action, the stripping composition is readily removed from the substrate or article to which it has previously been applied, e.g., by rinse, wash, or other removal step(s), as may be desired and efficacious in a given end use application of the compositions of the present invention.

The features and advantages of the invention are more fully illustrated by the following non-limiting examples, wherein all parts and percentages are by weight, unless otherwise expressly stated.

EXAMPLE 1

Formulations A, B, C, and D were prepared as described below, wherein IDA is iminodiacetic acid and $NH_4F$ is ammonium fluoride (anhydrous).

Formulation A 0.5% IDA 1.0% $NH_4F$ 98.5% mixture 3:1 propyleneglycol:water

Formulation B 1.5% IDA 1.0% $NH_4F$ 97.5% mixture 3:1 propyleneglycol:water

Formulation C 0.5% IDA 4.0% $NH_4F$ 95.5% mixture 3:1 propyleneglycol:water

Formulation D 1.5% IDA 4.0% $NH_4F$ 94.5% mixture 3:1 propyleneglycol:water

Etch rates of Formulations A–D were measured for thin films coated on silicon wafers.

Etch rates, in Angstroms per minute (Å/min), are given in Table 1 below, for borophosphate silicate glass (BPSG) and plasma-enhanced chemical vapor deposited tetraethoxysilicate (TEOS).

TABLE 1

Etch Rates (Å/min) of Formulations A–D on BPSG and TEOS Films

| Material Exposed to Stripping Formulation | Formulation A Etch Rate (Å/min) | Formulation B Etch Rate (Å/min) | Formulation C Etch Rate (Å/min) | Formulation D Etch Rate (Å/min) |
|---|---|---|---|---|
| BPSG | 229 | 430 | 276 | 467 |
| TEOS | 161 | 372 | 230 | 541 |

Etch rates were then determined for the respective Formulations A–D on the following materials:

SARC, a commercially available dyed silicon oxide sacrificial material;

ILD, a commercially available CVD porous OSG dielectric material;

CORAL™ dielectric, an OSG low-k dielectric material commercially available from Novellus Systems; and PECVD TEOS, a silicon dioxide coating deposited by plasma-enhanced chemical vapor deposition using tetraethylorthosilicate precursor.

The etch rates measured on the above-listed materials, in Å/min, are shown in Table 2 below.

TABLE 2

Etch Rates (Å/min) of Formulations A–D on SARC, ILD, CORAL and PECVD TEOS Materials

| Material Exposed to Stripping Formulation | Formulation A Etch Rate (Å/min) | Formulation B Etch Rate (Å/min) | Formulation C Etch Rate (Å/min) | Formulation D Etch Rate (Å/min) |
|---|---|---|---|---|
| SARC | 335 | 620 | 539 | 1876 |
| ILD | 8 | 26 | 39 | 181 |
| CORAL | 2.5 | 6.5 | 9.4 | 66 |
| PECVD TEOS | 161 | 372 | 230 | 541 |

EXAMPLE 2

Formulations E, F, G and H were prepared as described below.

Formulation E
0.5% IDA
1.0% NH$_4$F
25% water
73.5% diethylene glycol

Formulation F
0.5% IDA
1.0% NH4F
25% water
73.5% propylene glycol methyl ether

Formulation G
0.5% IDA
1.0% NH4F
25% water
73.5% diethylene glycol methyl ether

Formulation H
0.5% IDA
1.0% NH4F
25% water
73.5% triethylene glycol methyl ether Etch rates were then determined for the respective Formulations E–H on the following materials:
SARC, as in Example 1;
ILD, as in Example 1;
CORAL, as in Example 1; and
FSG, a low-k dielectric fluorinated silicate glass.

The etch rates measured on the above-listed materials, in Å/min, are shown in Table 3 below.

TABLE 3

Etch Rates (Å/min) of Formulations E–H on SARC, ILD, CORAL and FSG Materials

| Material Exposed to Stripping Formulation | Formulation E Etch Rate (Å/min) | Formulation F Etch Rate (Å/min) | Formulation G Etch Rate (Å/min) | Formulation H Etch Rate (Å/min) |
|---|---|---|---|---|
| SARC | 167 | 464 | 342 | 369 |
| ILD | 2.0 | 5.4 | 5.0 | 3.2 |
| CORAL | 0.2 | 8.0 | 8.3 | 8.2 |
| FSG | 114 | 282 | 173 | 179 |

EXAMPLE 3

Formulation I (pH=6.0) was prepared as described below.

Formulation I 0.5% ammonium fluoride 2.25% methyldiethanolamine 2.75% malonic acid 25% water 69.5 diethyleneglycol Etch rates were then determined for Formulation I on the following materials:
CORAL, as in Example 1;
Aurora™ 2.4 and Aurora™ 2.7, ILD materials currently commercially available from ASM International, with dielectric constants of k=2.4 and k=2.7, respectively;
LKD-5109, a spin-on, porous, low-k OSG dielectric material commercially available from JSR;
Orion™ dielectric, a CVD porous low-k OSG dielectric material commercially available from Trikon;
DUO 248™ and DUO 193™, spin-on SARC materials (having a siloxane backbone incorporating organic light-absorbing chromophores), which are currently commercially available from Honeywell Electronic Materials, and which are commercially utilized for 248 nm and 193 nm photolithography, respectively.

The etch rates of Formulation I measured on the above-listed materials, in Å/min, are shown in Table 4 below.

TABLE 4

Etch Rates (Å/min) of Formulation I on DUO 193, DUO 248, Aurora 2.4, Aurora 2.7, CORAL, LKD-5109 and Orion Materials

| Material Exposed to Stripping Formulation | Etch Rate (Å/min) |
|---|---|
| DUO 193 | 180 |
| DUO 248 | 423 |
| Aurora 2.4 | 3 |
| Aurora 2.7 | 0 |
| CORAL | 0 |
| LKD-5109 | 58 |
| Orion | 8 |

EXAMPLE 4

Formulation J (pH=7.1) was prepared as described below.

Formulation J

10% N,N-dimethyldiglycolamine hydrofluoride salt

25% water

65% diethylene glycol

Etch rates were then determined for Formulation J on the following materials:
DUO 248™, as in Example 3;
FSG, as in Example 3;
PECVD TEOS, as in Example 1; and
CORAL, as in Example 1.

The etch rates of Formulation J measured on the above-listed materials, in Å/min, are shown in Table 5 below.

TABLE 5

Etch Rates (Å/min) of Formulation J on DUO 248, FSG, PECVD TEOS and CORAL Materials

| Material Exposed to Stripping Formulation | Etch Rate (Å/min) |
|---|---|
| DUO 248 | 262 |
| FSG | 7.5 |
| PECVD TEOS | 12 |
| CORAL | 0 |

EXAMPLE 5

Formulation K (pH=8.0) was prepared as described below.

Formulation K

40% N,N-dimethyldiglycolamine hydrofluoride salt
25% water
35% diethyleneglycol

Etch rates were then determined for Formulation K on the following materials:
DUO 248™, as in Example 3;
FSG, as in Example 3;
PECVD TEOS, as in Example 1; and
CORAL, as in Example 1.

The etch rates of Formulation K measured on the above-listed materials, in Å/min, are shown in Table 6 below.

TABLE 6

Etch Rates (Å/min) of Formulation K on DUO 248, FSG, PECVD TEOS and CORAL Materials

| Material Exposed to Stripping Formulation | Etch Rate (Å/min) |
|---|---|
| DUO 248 | 330 |
| FSG | 2.3 |
| PECVD TEOS | 4.5 |
| CORAL | 1.4 |

The foregoing examples demonstrate that the stripping compositions of the invention possess high etch rate selectivity, exhibiting high etch rates on sacrificial silicate materials and low etch rate on permanent silicate ILD materials. The stripping compositions of the invention therefore are highly useful in applications where sacrificial and permanent silicates are both present in the original material.

The stripping compositions of the invention are readily formulated with suitable solvent systems, e.g., semi-aqueous solvent systems, having low toxicity and low combustibility.

Accordingly, the stripping compositions of the present invention achieve a substantial advance in the art of removing sacrificial silicate materials, e.g., in applications in which the sacrificial silicate is present with permanent silicate materials, in the manufacture of integrated circuit devices.

Although the invention has been variously disclosed herein with reference to illustrative embodiments and features, it will be appreciated that the embodiments and features described hereinabove are not intended to limit the invention, and that other variations, modifications and other embodiments will suggest themselves to those of ordinary skill in the art. The invention therefore is to be broadly construed, consistent with the claims hereafter set forth.

What is claimed is:

1. A wet stripping composition selected from the group consisting of Formulations A–H:
   Formulation A
   0.5% IDA
   1.0% NH$_4$F
   98.5% mixture 3:1 propyleneglycol:water
   Formulation B
   1.5% IDA
   1.0% NH$_4$F
   97.5% mixture 3:1 propyleneglycol:water
   Formulation C
   0.5% IDA
   4.0% NH$_4$F
   95.5% mixture 3:1 propyleneglycol:water
   Formulation D
   1.5% IDA
   4.0% NH$_4$F
   94.5% mixture 3:1 propyleneglycol:water
   Formulation E
   0.5% IDA
   1.0% NH$_4$F
   25% water
   73.5% diethylene glycol
   Formulation F
   0.5% IDA
   1.0% NH4F
   25% water
   73.5% propylene glycol methyl ether
   Formulation G
   0.5% IDA
   1.0% NH4F
   25% water
   73.5% diethylene glycol methyl ether
   Formulation H
   0.5% IDA
   1.0% NH4F
   25% water
   73.5% triethylene glycol methyl ether
   wherein percentages of components in said Formulations are by weight, based on total weight of the Formulation.

2. The wet stripping composition of claim 1, comprising Formulation A.

3. The wet stripping composition of claim 1, comprising Formulation B.

4. The wet stripping composition of claim 1, comprising Formulation C.

5. The wet stripping composition of claim 1, comprising Formulation D.

6. The wet stripping composition of claim 1, comprising Formulation E.

7. The wet stripping composition of claim 1, comprising Formulation F.

8. The wet stripping composition of claim 1, comprising Formulation G.

9. The wet stripping composition of claim 1, comprising Formulation H.

10. A method of etchingly removing sacrificial silicate material from a locus comprising same, comprising exposing said sacrificial silicate material to an etchant composition, wherein said etchant composition is selected from the group consisting of Formulations A–H:

Formulation A
0.5% IDA
1.0% NH$_4$F
98.5% mixture 3:1 propyleneglycol:water
Formulation B
1.5% IDA
1.0% NH$_4$F
97.5% mixture 3:1 propyleneglycol:water
Formulation C
0.5% IDA
4.0% NH$_4$F
95.5% mixture 3:1 propyleneglycol:water
Formulation D
1.5% IDA
4.0% NH$_4$F
94.5% mixture 3:1 propyleneglycol:water
Formulation B
0.5% IDA
1.0% NH$_4$F
25% water
73.5% diethylene glycol
Formulation F
0.5% IDA
1.0% NH4F
25% water
73.5% propylene glycol methyl ether
Formulation G
0.5% IDA
1.0% NH4F
25% water
73.5% diethylene glycol methyl ether
Formulation H
0.5% IDA
1.0% NH4F
25% water
73.5% triethylene glycol methyl ether wherein percentages of components in said Formulations are by weight, based on total weight of the Formulation.

11. The method of claim 10, wherein the locus comprises a semiconductor device structure.

12. The method of claim 11, wherein said semiconductor device structure comprises an ILD material.

13. The method of claim 12, wherein the sacrificial silicate material comprises a sacrificial anti-reflective coating.

14. The method of claim 13, wherein the sacrificial anti-reflective coating comprises a dyed silicate glass material.

15. The method of claim 14, wherein the dyed silicate glass material has been applied to a semiconductor device structure to minimize reflectivity variations during photolithographic patterning on the semiconductor device structure.

16. A wet stripping composition, comprising:
a nitrogenous hydrofluoride;
deionized water;
organic solvent;
chelator; and
optionally an amine/carboxylic acid buffer;
wherein said chelator comprises an α-amino acid.

17. A wet stripping composition comprising semi-aqueous solvent, ammonium fluoride and an amino acid conferring on said composition etch rate selectivity between SARC and ILD material, wherein the amino acid comprises iminodiacetic acid.

18. A method of etchingly removing sacrificial silicate material from a locus comprising same, comprising exposing said sacrificial silicate material to an etchant composition, wherein said etchant composition comprises:
a nitrogenous hydrofluoride;
deionized water;
organic solvent;
chelator; and
optionally an amine/carboxylic acid buffer;
wherein said chelator comprises an α-amino acid.

19. The method of claim 18, wherein the locus comprises a semiconductor device structure.

20. The method of claim 19, wherein said semiconductor device structure comprises an ILD material.

21. The method of claim 18, wherein the sacrificial silicate material comprises a sacrificial anti-reflective coating.

22. The method of claim 21, wherein the sacrificial anti-reflective coating comprises a dyed silicate glass material.

23. The method of claim 22, wherein the dyed silicate glass material has been applied to a semiconductor device structure to minimize reflectivity variations during photolithographic patterning on the semiconductor device structure.

* * * * *